METHOD OF FORMING A RECESS IN A SEMICONDUCTOR SUBSTRATE
HAVING AT LEAST ONE PN JUNCTION
Filed Nov. 13, 1968

United States Patent Office 3,570,195

Patented Mar. 16, 1971

3,570,195

METHOD OF FORMING A RECESS IN A SEMICONDUCTOR SUBSTRATE HAVING AT LEAST ONE PN JUNCTION

Michio Otsuka, Tokyo, and Syuji Sugioka, Yokohama-shi, Japan, assignors to Tokyo Shibaura Electric Co., Ltd., Kawasaki-shi, Japan Filed Nov. 13, 1968, Ser. No. 775,316
Claims priority, application Japan, Mar. 21, 1968, 43/17,951
Int. Cl. B24c *1/00*
U.S. Cl. 51—320 5 Claims

ABSTRACT OF THE DISCLOSURE

A method of forming in a semiconductor substrate a recess whose depth can be controlled exactly to a desired extent, which comprises the steps of generating a depletion layer near and at the PN junction of said substrate, boring a part of said substrate starting with the exposed surface down to the depletion layer thereof so as to cause the current flowing through the PN junction to attain a certain level.

The present invention relates to a method of fabricating a semiconductor substrate and particularly to a method of forming a recess to a very accurate depth with extremely high precision in a semiconductor substrate provided with at least one PN junction.

There are occasions where there is bored a recess extending vertically or slantwise from the surface of a semiconductor substrate provided with at least one PN junction down to said PN junction. In such case it is often required to cut out a recess to an accurate depth with high precision. The conventional practice of providing said recess has customarily been to employ mechanical cutting or chemical etching and the depth of the recess has been controlled either by the extent of pressing a cutting blade into a semiconductor substrate or by selecting a proper kind of etching solution and regulating the time of such etching. However, these means of adjustment had the drawback that they were accompanied with great difficulties in working a recess to a very accurate depth with high precision.

The object of the present invention is to provide a method of easily forming a recess in a semiconductor substrate to a prescribed depth with high precision by causing electrical signals to be issued when the prescribed depth is reached in boring the substrate to obtain said recess.

SUMMARY OF THE INVENTION

In accordance with this invention, the method of forming a recess in a semiconductor substrate, having at least one PN junction comprises the steps of impressing a reverse bias voltage on the semiconductor substrate using a circuit supplying said reverse bias voltage while operating a means for detecting variations in the circuit current so as to form a depletion layer in said substrate, gradually boring a part of the substrate starting with the exposed surface of the substrate down to the depletion layer, and stopping said boring operation when current variations of a certain magnitude are observed during operation in the reverse bias voltage circuit by the aforesaid detecting means.

Figure 1A:
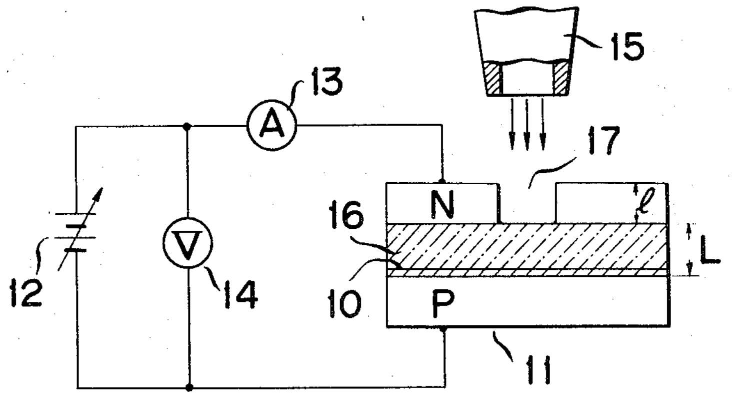
Figure 2:
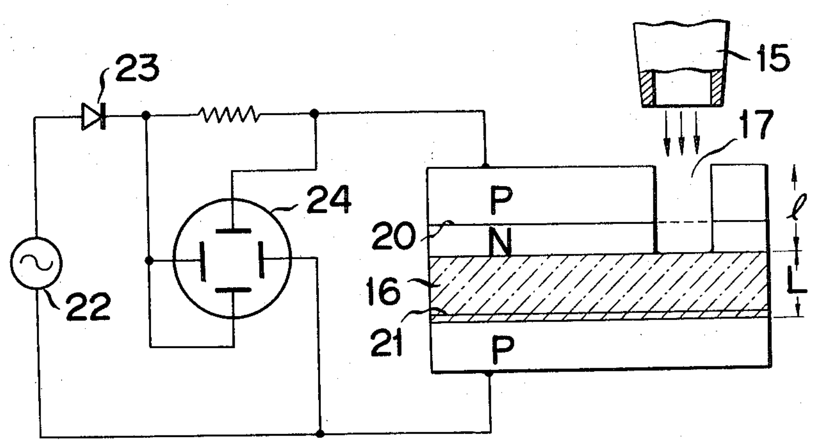
Figure 1B:
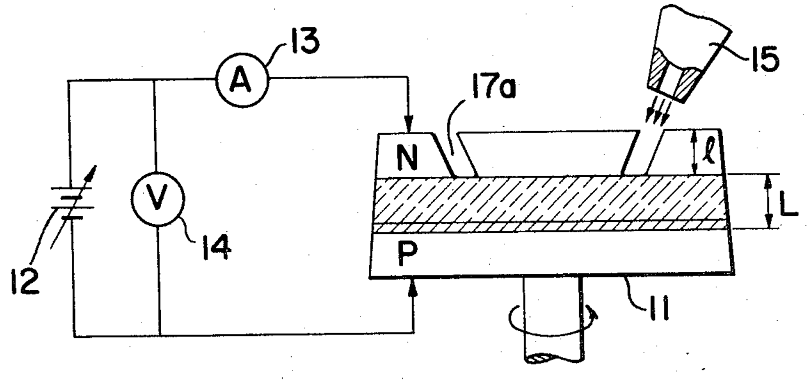

The present invention can be more fully understood from the following detailed description when taken in connection with the accompanying drawing, in which:

FIGS. 1*a* and 1*b* are schematic illustrations of a method according to an embodiment of the present invention where a semiconductor substrate having one PN junction is bored; and FIG. 2 is a schematic illustration of a method according to another embodiment of the invention where a semiconductor substrate having two PN junctions is bored.

There will now be described an embodiment of the present invention by reference to FIG. 1*a*. The semiconductor substrate 11 having one PN junction 10 is used as the raw material of, for example, a rectifier element. In this case, a layer of N-type conductivity has a lower impurity concentration, namely, higher resistivity than a layer of P-type conductivity. Across the top surface of the N-type layer and that of the P-type layer is connected a variable D.C. power source so as to impress a reverse bias voltage on the PN junction. To the power source 12 is connected an ammeter 13 in series and a voltmeter 14 in parallel. Further, there is disposed, for example, opposite to the central part of the surface of the N-type layer and at a prescribed space therefrom a nozzle 15 having a prescribed inner diameter whose axis is so arranged as to intersect the plane of the PN junction 10, for example, in a vertical direction. The nozzle 15 is intended to bore a part of the surface of the N-type layer by ejecting thereon grinding particles consisting of, for example, powders of aluminium oxide or carborundum together with gases such as compressed air or nitrogen.

When the PN junction 10 of the semiconductor substrate 11 is impressed with a reverse bias voltage, the resultant depletion layer 16 expands mainly to the side of the N-type or high resistivity layer as indicated by the dotted hatching of FIG. 1*a*. In this case the width L of the space charge region 16 is derived from the equation:

$$L=\left(\frac{2K}{Qn_N}\right)^{1/2}\cdot(V)^{1/2}$$

where:

K: dielectric constant of the substrate
V: impressed voltage
Q: electron charge
$n_N$: impurity concentration in the N-type layer $$\left(\frac{2K}{Qn_N}\right)^{1/2}\cdot(V)^{1/2}$$

is determined by the semiconductor substrate 11 itself and so may be deemed as a constant.

Accordingly, the width L can be easily determined as a function of the voltage V alone. There will now be described the method of the invention by reference to the appended drawing. From the nozzle 15 are ejected grinding particles to the top surface of the N-type layer of the semiconductor substrate 11 to bore a recess 17 by grinding in a part of the surface. In this case the depth of the recess 17 is gradually extended by continuing said grinding while observing the amplitude of indicator moving on the dial of the ammeter 13. When the depth of the recess 17 attains a length *l*, the distance between the surface of the N-type layer and the space charge region 16, then there will be introduced appreciably large amounts of leak current into a reverse bias circuit through the vicinity of the inner wall of the recess 17 and space charge region 16 causing the ammeter indicator to move rapidly. Upon the occurrence of such quick motion, the grinding operation is stopped. The leak current is considered to result from the formation of the bottom wall of the recess of a broken layer due to the grinding operation, which extends up to the space charge region 16. The aforementioned gas ejected from the nozzle 15 along with grinding particles may be replaced by liquids such as water, oil, organic solvents, etc. It is also permissible to use a chemical etching liquid such as fluoric acid and nitric acid for the same purpose. It may be similarly advisable to bore said recess 17 by an ultrasonic wave process.

It is possible freely to change the shape and position of the recess 17 by varying the shape of the nozzle 15 and its position relative to the semiconductor substrate 11. For instance, as shown in FIG. 1*b*, if the nozzle 15 is inclined relative to the PN junction of the semiconductor substrate 11 there will be obtained a slant recess. If the substrate is, under this condition, rotated about its axis, there will be formed an annular slant recess 17*a*. Where it is required to impress a remarkably large reverse bias voltage so as to broaden the width L of the space charge region 16, it is advisable to chemically clean the surface of the semiconductor substrate 11 in advance using an etching liquid or the like and to coat the surface with protective insulation so as to prevent the damage of the surface.

According to the method of the present invention, a prescribed reverse bias voltage is impressed on the PN junction of the semiconductor substrate 11 to generate a space charge region 16 having a prescribed width L of expansion. When the depth of a recess 17 reaches the space charge region 16 after its boring is started, then there will appear in the reverse bias circuit sharply increased leak current. At this time, the ammeter connected to said circuit indicates sudden changes in the current. Accordingly, if the boring of said recess 17 is stopped immediately at the moment such current variations take place, it will be possible easily to cut the recess 17 to an accurate depth with high precision. Moreover, the selection of the recess depth can be made simply by setting the reverse bias voltage V at a proper value. Also where it is desired to form a recess of the same depth in a large number of semiconductor substrates of the same kind, it is possible to prepare semiconductor substrates provided with recesses of an equal depth by impressing a reverse bias voltage thereon under the same conditions. Such quantity production of a semiconductor substrate has very great practical advantage.

FIG. 2 shows the case where the method of the present invention is applied to a semiconductor substrate composed of a PNP-type crystal plate assembly. Of the two PN junctions 20 and 21, the latter is impressed with a reverse bias voltage to generate a space charge region 16 around it. And there is bored a recess 17 starting with the surface of the P-type layer on the side of the junction 20 down to the interior of the N-type layer. In this case the power source 22 supplies an alternating current, a reverse bias circuit has a diode 23 connected thereto in series and rectification is carried out by half waves. Also for determining of current variations in the reverse bias circuit during the formation of a recess, there is used an oscilloscope 24 which is connected to said circuit as shown in FIGS. 1 and 2 are all applicable to PN and PNP type substrates.

It is also possible automatically to stop the jetting operation of the nozzle by connecting a relay circuit (not shown) operable in accordance with variations in the leak current and interlocking said circuit with the grinding particle jetting mechanism of the nozzle. It will be apparent that the method of the present invention is also applicable to a semiconductor substrate provided with four PNPN layers or more.

What is claimed is:

1. A method of forming a recess in a semiconductor substrate having at least one PN junction comprising:

impressing a reverse bias voltage on the semiconductor substrate by means of a reverse bias circuit to form a depletion layer in said substrate;

detecting and monitoring variations in the current flowing in said reverse bias circuit;

gradually eliminating a part of the substrate starting with the exposed surface of the substrate down towards the depletion layer; and stopping said eliminating operation when the detected current variations in the reverse bias circuit are a predetermined magnitude.

2. A method according to claim 1 wherein said eliminating step includes ejecting grinding particles from a nozzle onto the top surface of the substrate.

3. A method according to claim 1 wherein said eliminating step includes ejecting grinding particles onto the top surface of the substrate while the substrate is rotated about its axis.

4. A method according to claim 1 wherein said eliminating step is stopped responsive to detection of a sharply increased current in said reverse bias circuit, thereby indicating that the recess has reached the space charge region in the semiconductor substrate.

5. A method according to claim 1 wherein said eliminating step includes ejecting grinding particles onto the top surface of the substrate from a nozzle inclined to the PN junction of the substrate while the substrate is rotated about its axis.

References Cited

UNITED STATES PATENTS

| | | | |
|---|---|---|---|
| 2,748,041 | 5/1956 | Leverenz | 29—583X |
| 2,773,332 | 12/1956 | Buchman et al. | 51—319X |
| 3,097,458 | 7/1963 | Richmond | 29—583X |
| 3,262,234 | 7/1966 | Roach | 51—320 |
| 3,453,781 | 7/1969 | Greenman | 51—8 |

LESTER M. SWINGLE, Primary Examiner

U.S. Cl. X.R.

29—583